(12) United States Patent
Satou et al.

(10) Patent No.: US 8,058,892 B2
(45) Date of Patent: Nov. 15, 2011

(54) RADIOFREQUENCY CONTACTOR

(75) Inventors: Kunihiro Satou, Tokyo (JP); Tomoyuki Kamiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 337 days.

(21) Appl. No.: 12/480,810

(22) Filed: Jun. 9, 2009

(65) Prior Publication Data

US 2010/0178778 A1     Jul. 15, 2010

(30) Foreign Application Priority Data

Jan. 9, 2009 (JP) .................................. 2009-003780

(51) Int. Cl.
*G01R 31/26* (2006.01)

(52) U.S. Cl. ............... 324/762.01; 324/537; 324/754.03; 324/500

(58) Field of Classification Search .................. None
See application file for complete search history.

(56) References Cited

U.S. PATENT DOCUMENTS

| | | | |
|---|---|---|---|
| 6,889,155 B2 * | 5/2005 | Ogino et al. | 702/113 |
| 6,917,210 B2 * | 7/2005 | Miller | 324/754.18 |

FOREIGN PATENT DOCUMENTS

| | | |
|---|---|---|
| JP | 63-185575 U | 11/1988 |
| JP | 03-125503 U | 12/1991 |
| JP | 2002-350467 A | 12/2002 |

\* cited by examiner

*Primary Examiner* — Huy Q Phan
*Assistant Examiner* — Trung Nguyen
(74) *Attorney, Agent, or Firm* — Leydig, Voit & Mayer, Ltd.

(57) ABSTRACT

A radiofrequency contactor includes a testing circuit board having a dielectric substrate, a lower ground conductor on a lower surface of the dielectric substrate, and a radiofrequency signal wiring conductor on an upper surface of the dielectric substrate, a radiofrequency signal pin contactor located on the upper surface of the dielectric substrate and connected to the radiofrequency signal wiring conductor, a ground block located on the upper surface of the dielectric substrate and spaced apart from the radiofrequency signal wiring conductor and the radiofrequency signal pin contactor, and a first side ground conductor and a second side ground conductor provided on the upper surface of the dielectric substrate and spaced apart from the radiofrequency signal wiring conductor and the radiofrequency signal pin contactor.

14 Claims, 5 Drawing Sheets

RADIOFREQUENCY CONTACTOR

BACKGROUND OF THE INVENTION

1. Field of the Invention

The present invention relates to a radiofrequency contactor which electrically connects a radiofrequency semiconductor device and a testing circuit board when electrical characteristics of the radiofrequency semiconductor device are inspected and, more particularly, to a radiofrequency contactor capable of preventing a deterioration of a radiofrequency signal.

2. Background Art

When electrical characteristics of the radiofrequency semiconductor device are inspected, sending/receiving of radiofrequency signals is performed between a testing apparatus and the radiofrequency semiconductor device through wiring on a testing circuit board. Doing so requires electrical conduction between electrodes of the radiofrequency semiconductor device and the wiring on the testing circuit board. A contactor has been used for conduction between electrodes of a radiofrequency semiconductor device and wiring on a testing circuit board (see, e.g., Patent Document 1).

[Patent Document 1] Japanese Utility Model Laid-Open No. Hei 03-125503

The above-described contactor includes a testing circuit board, a pin contactor and a ground conductor opposed to the pin contactor. The testing circuit board is constituted of a wiring conductor and a lower surface ground conductor provided on a lower surface so as to face the wiring conductor. The characteristic impedance of the wiring conductor of the testing circuit board is adjusted to a certain value. The pin contactor and the ground conductor opposed to the pin contactor are respectively connected to the wiring conductor and the lower surface ground conductor of the testing circuit board.

When electrical characteristics of a radiofrequency semiconductor device are inspected by using the contactor, sending/receiving of a radiofrequency signal between the wiring conductor of the testing circuit board and the electrode of the radiofrequency semiconductor device is performed through the pin contactor. The sizes, shapes and placed positions of the pin contactor and the ground conductor opposed to the pin contactor are determined under constraints according to the size, structure, etc., of the radiofrequency semiconductor device. There is, therefore, a possibility of failure to match the characteristic impedance of the pin contactor to the characteristic impedance of the wiring conductor of the testing circuit board. In such a case, there is a problem that the radiofrequency signal deteriorates when passing through the pin contactor.

SUMMARY OF THE INVENTION

In view of the above-described problem, an object of the present invention is to provide a radiofrequency contactor capable of preventing deterioration of a radiofrequency signal.

According to one aspect of the present invention, a radiofrequency contactor for inspecting electrical characteristics of a radiofrequency semiconductor device having a radiofrequency signal electrode and a ground electrode, includes a testing circuit board of a microstrip line structure, a radiofrequency signal pin contactor, a ground block, a first side ground conductor and a second side ground conductor. The testing circuit board of a microstrip line structure has a dielectric substrate, a lower surface ground conductor formed on a lower surface of the dielectric substrate, and a radiofrequency signal wiring conductor formed on an upper surface of the dielectric substrate. The radiofrequency signal pin contactor is provided on the upper surface of the dielectric substrate and connected to the radiofrequency signal wiring conductor. The ground block is provided on the upper surface of the dielectric substrate while being spaced apart from the radiofrequency signal wiring conductor and the radiofrequency signal pin contactor, the ground block being connected to the lower surface ground conductor. The first side ground conductor and a second side ground conductor is provided on the upper surface of the dielectric substrate while being spaced apart from the radiofrequency signal wiring conductor and the radiofrequency signal pin contactor, the first side ground conductor and the second side ground conductor being connected to the ground block. A radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device at the time of inspection. The ground block is conductive to the ground electrode of the radiofrequency semiconductor device at the time of inspection. The first side ground conductor is provided on the upper surface of the dielectric substrate away from the radiofrequency signal pin contactor in a direction perpendicular to a direction in which the ground block and the radiofrequency signal pin contactor are opposed to each other. The second side ground conductor is provided on the upper surface of the dielectric substrate across the radiofrequency signal pin contactor from the first side ground conductor.

According to another aspect of the present invention, a radiofrequency contactor for inspecting electrical characteristics of a radiofrequency semiconductor device having a radiofrequency signal electrode and a ground electrode, includes a testing circuit board of a microstrip line structure, a radiofrequency signal pin contactor, a ground block. The testing circuit board of a microstrip line structure has a dielectric substrate, a lower surface ground conductor formed on a lower surface of the dielectric substrate, and a radiofrequency signal wiring conductor formed on an upper surface of the dielectric substrate. The radiofrequency signal pin contactor provided on the upper surface of the dielectric substrate and connected to the radiofrequency signal wiring conductor. The ground block provided on the upper surface of the dielectric substrate while being spaced apart from the radiofrequency signal wiring conductor and the radiofrequency signal pin contactor, the ground block being connected to the lower surface ground conductor. A radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device at the time of inspection. The ground block is conductive to the ground electrode of the radiofrequency semiconductor device at the time of inspection. The radiofrequency signal pin contactor is constructed so that its thickness decreases with approach to its tip. The ground block is constructed so that the distance between the radiofrequency signal pin contactor and a portion of the ground block opposed to the radiofrequency signal pin contactor becomes smaller with approach to the tip of the radiofrequency signal pin contactor.

According to another aspect of the present invention, a radiofrequency contactor for inspecting electrical characteristics of a radiofrequency semiconductor device having a radiofrequency signal electrode and a ground electrode, includes a testing circuit board of a microstrip line structure, a radiofrequency signal pin contactor, a ground block. The testing circuit board of a microstrip line structure having a dielectric substrate, a lower surface ground conductor formed on a lower surface of the dielectric substrate, and a radiofrequency signal wiring conductor formed on an upper surface of the dielectric substrate. The radiofrequency signal pin contactor provided on the upper surface of the dielectric substrate and connected to the radiofrequency signal wiring conductor. The ground block provided on the upper surface of the dielectric substrate while being spaced apart from the radiofrequency signal wiring conductor and the radiofrequency signal pin contactor, the ground block being connected to the lower surface ground conductor. A radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device at the time of inspection. The ground block is conductive to the ground electrode of the radiofrequency semiconductor device at the time of inspection. The lower surface ground conductor has a projection projecting toward the radiofrequency signal pin contactor on its portion opposed to the radiofrequency signal pin contactor through the radiofrequency signal wiring conductor and the dielectric substrate.

According to another aspect of the present invention, a radiofrequency contactor for inspecting electrical characteristics of a radiofrequency semiconductor device having a radiofrequency signal electrode and a ground electrode, the radiofrequency contactor, includes a testing circuit board of a microstrip line structure, a radiofrequency signal pin contactor and a ground block. The testing circuit board of a microstrip line structure having a dielectric substrate, a lower surface ground conductor formed on a lower surface of the dielectric substrate, and a radiofrequency signal wiring conductor formed on an upper surface of the dielectric substrate. The radiofrequency signal pin contactor provided on the upper surface of the dielectric substrate and connected to the radiofrequency signal wiring conductor. The ground block provided on the upper surface of the dielectric substrate while being spaced apart from the radiofrequency signal wiring conductor and the radiofrequency signal pin contactor, the ground block being connected to the lower surface ground conductor. A radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device at the time of inspection. The ground block is conductive to the ground electrode of the radiofrequency semiconductor device at the time of inspection. The radiofrequency signal wiring conductor is constructed so that the width of the radiofrequency signal wiring conductor becomes closer to the width of the radiofrequency signal pin contactor with approach to the connection between the radiofrequency signal wiring conductor and the radiofrequency signal pin contactor.

Other objects and further features of the present invention will be apparent from the following detailed description when read in conjunction with the accompanying drawings.

DETAILED DESCRIPTION OF THE PREFERRED EMBODIMENTS

Figure 1:
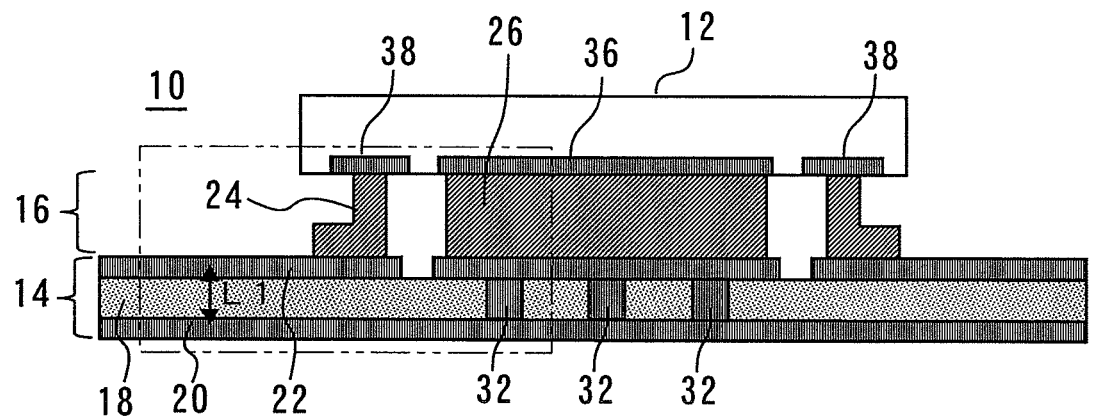
FIG. 1 is a sectional view showing a state where a radiofrequency semiconductor device is connected to a radiofrequency contactor according to the first embodiment.

Now, embodiments of the present invention will be described with reference to the drawings. Like reference numerals denote like components throughout the drawings, and redundant descriptions will be omitted.

First Embodiment

A first embodiment of the present invention relates to a radiofrequency contactor for inspecting electrical characteristics of a radiofrequency semiconductor device having a radiofrequency signal electrode and a ground electrode.

<Construction of Radiofrequency Contactor According to the First Embodiment>

Figure 2:
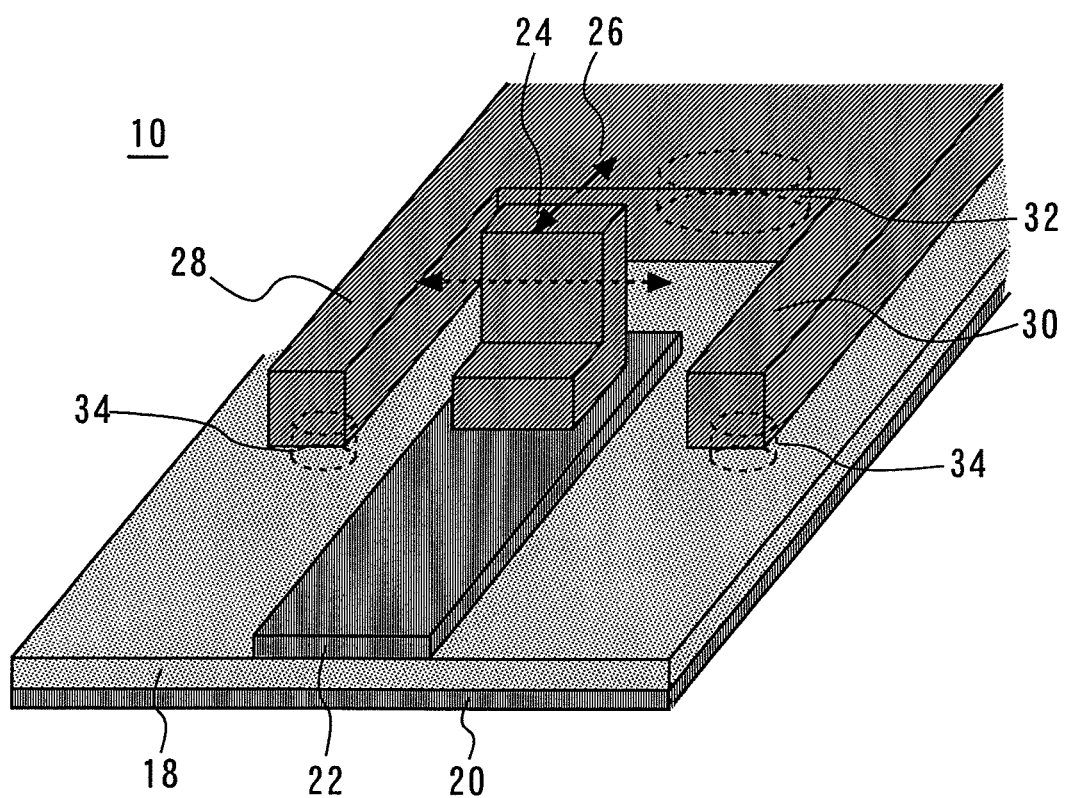
FIG. 2 is a perspective view of a portion surrounded by a double-dot-dash line in FIG. 1.

The construction of a radiofrequency contactor according to the first embodiment will be described. FIG. 1 is a sectional view showing a state where a radiofrequency semiconductor device is connected to a radiofrequency contactor according to the first embodiment. FIG. 2 is a perspective view of a portion surrounded by a double-dot-dash line in FIG. 1. In FIG. 2, illustration of the radiofrequency semiconductor device 12 is omitted to enable the radiofrequency contact 10 to be easily seen.

The radiofrequency contactor 10 includes a testing circuit board 14 and a contact portion 16. The testing circuit board 14 includes a dielectric substrate 18, a lower surface ground conductor 20 formed on the lower surface of the dielectric substrate 18, and a radiofrequency signal wiring conductor 22 formed on the upper surface of the dielectric substrate 18. The contact portion 16 includes, as members respectively formed the upper surface of the dielectric substrate 18, a radiofrequency signal pin contactor 24, a ground block 26, a first side ground conductor 28 and a second side ground conductor 30. The radiofrequency signal pin contactor 24 is connected to the radiofrequency signal wiring conductor 22 of the testing circuit board 14. The ground block 26, the first side ground conductor 28 and the second side ground conductor 30 are provided by being spaced apart from the radiofrequency signal wiring conductor 22 and the radiofrequency signal pin contactor 24.

The ground block 26 is connected to the lower surface ground conductor 20 of the testing circuit board 14 through a via 32 provided in the dielectric substrate 18. The first side ground conductor 28 and the second side ground conductor 30 are connected to the ground block 26 and are also connected to the lower surface ground conductor 20 in the testing circuit board 14 through vias 34. The first side ground conductor 28 is located in a direction from the radiofrequency signal pin contactor 24 (the direction of the broken line arrow in FIG. 2) perpendicular to the direction in which the ground block 26 and the radiofrequency signal pin contactor 24 are opposed to each other (the direction of the solid line arrow in FIG. 2) on the upper surface of the dielectric substrate 18. The second side ground conductor 30 is located across the radiofrequency signal pin contactor 24 from the first side ground conductor 28 on the upper surface of the dielectric substrate 18.

In the testing circuit board 14, the dielectric substrate 18, the lower surface ground conductor 20 and the radiofrequency signal wiring conductor 22 constitute a microstrip line structure. In the microstrip line structure, the distance between the radiofrequency signal wiring conductor 22 and the lower surface ground conductor 20 (L1 in FIG. 1) is set constant and the characteristic impedance of the radiofrequency signal wiring conductor 22 is adjusted to a certain value. On the other hand, in the contact portion 16, the ground block 26 and the radiofrequency signal pin contactor 24 constitute a microstrip line structure.

<Method of Inspection Through Radiofrequency Contactor According to the First Embodiment>

A method of inspecting electrical characteristics of the radiofrequency semiconductor device 12 through the radiofrequency contactor 10 according to the first embodiment will be described.

First, the ground block 26 and the radiofrequency signal pin contactor 24 are respectively connected to a ground electrode 36 and a radiofrequency signal electrode 38 of the radiofrequency semiconductor device 12.

Next, an inspection is made by performing sending/receiving of a radiofrequency signal between a testing apparatus and the radiofrequency semiconductor device 12 via the radiofrequency signal wiring conductor 22. At this time, the ground block 26 is brought into conduction to the ground electrode 36 of the radiofrequency semiconductor device 12. A radiofrequency signal passes through the radiofrequency signal wiring conductor 22 and then passes through the radiofrequency signal pin contactor 24 to the radiofrequency semiconductor device 12 through the radiofrequency signal electrode 38.

Advantages of the First Embodiment

Figure 3:
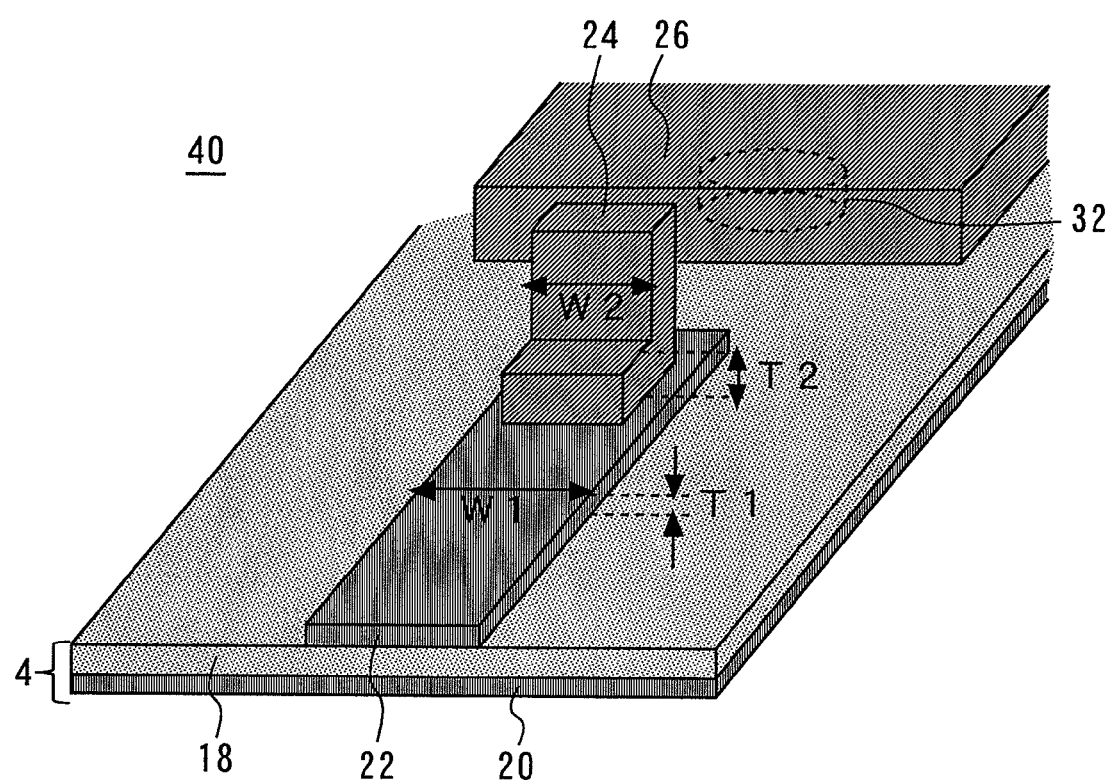
FIG. 3 is a perspective view showing a radiofrequency contactor according to the comparative example.

A comparative example of a radiofrequency contactor compared with the radiofrequency contactor 10 will first be described for description of the advantages of the first embodiment. FIG. 3 is a perspective view showing a radiofrequency contactor according to the comparative example. FIG. 3 corresponds to FIG. 2 showing the radiofrequency contactor 10 according to the first embodiment. As shown in FIG. 3, the radiofrequency contactor 40 according to the comparative example differs from the radiofrequency contactor 10 according to the first embodiment in that it does not have the first side ground conductor 28 and the second side ground conductor 30. In other respects, the construction of the radiofrequency contactor 40 according to the comparative example is the same as that of the radiofrequency contactor 10. In FIG. 3, for reference in description of sixth and seventh embodiments, the width and thickness of the radiofrequency signal wiring conductor 22 are indicated by W1 and T1, respectively, and the width and thickness of the radiofrequency signal pin contactor 24 are indicated by W2 and T2, respectively.

In each of the radiofrequency contactor 10 and the radiofrequency contactor 40 according to the comparative example, the sizes and shapes of the radiofrequency signal pin contactor 24 and the ground block 26 and the positions in which the radiofrequency signal pin contactor 24 and the ground block 26 are respectively placed are determined under constraints according to the size, structure, etc., of the radiofrequency semiconductor device. The microstrip line structure constituted of the radiofrequency signal pin contactor 24 and the ground block 26 is determined from the sizes, shapes and placed positions of the radiofrequency signal pin contactor 24 and the ground block 26. As a result, this microstrip line structure has an increased inductance component in comparison with the microstrip line structure of the testing circuit board 14. In the comparative example, therefore, the characteristic impedance of the radiofrequency signal pin contactor 24 is higher than the characteristic impedance of the radiofrequency signal wiring conductor 22 (a constant value). Thus, the characteristic impedance of the radiofrequency signal pin contactor 24 does not match the characteristic impedance of the radiofrequency signal wiring conductor 22. With inspection of the radiofrequency semiconductor device 12 in the comparative example, therefore, there is a problem that a radiofrequency signal deteriorates when passing through the radiofrequency signal pin contactor 24.

On the other hand, in the radiofrequency contactor 10 according to the first embodiment, the lower surface ground conductor 20 is conductive to lower portions of the first side ground conductor 28 and the second side ground conductor 30 through the vias 34, and the first side ground conductor 28 and the second side ground conductor 30 are conductive to the ground block 26 when a radiofrequency signal passes through the radiofrequency signal pin contactor 24 when an inspection is made. The first side ground conductor 28 and the second side ground conductor 30 as well as the ground block 26 have the role of a ground surface in the microstrip line structure constituted of the radiofrequency signal pin contactor 24 and the ground block 26. The capacitive component is thereby increased in the microstrip line structure to cancel out the influence of the above-described increase in the inductance component on the characteristic impedance. In this way, an increase in characteristic impedance of the radiofrequency signal pin contactor 24 relative to the characteristic impedance (a constant value) of the radiofrequency signal wiring conductor 22 can be limited. Consequently, in the first embodiment, the characteristic impedance of the radiofrequency signal pin contactor 24 and the characteristic impedance of the radiofrequency signal wiring conductor 22 can be matched to each other. Prevention of a deterioration of a radiofrequency signal passing through the radiofrequency signal pin contactor 24 in an inspection of the radiofrequency semiconductor device 12 is thus enabled.

Even if the first side ground conductor 28 and the second side ground conductor 30 are not connected to the lower surface ground conductor 20 in the testing circuit board 14 through the vias 34, the first side ground conductor 28 and the second side ground conductor 30 as well as the ground block 26 can have the role of a ground surface in the microstrip line structure constituted of the radiofrequency signal pin contactor 24 and the ground block 26. Prevention of a deterioration of a radiofrequency signal passing through the radiofrequency signal pin contactor 24 is thus enabled.

Second Embodiment

A radiofrequency contactor according to a second embodiment of the present invention will be described mainly with respect to a point of difference from the first embodiment.

<Construction of Radiofrequency Contactor According to the Second Embodiment>

Figure 4:
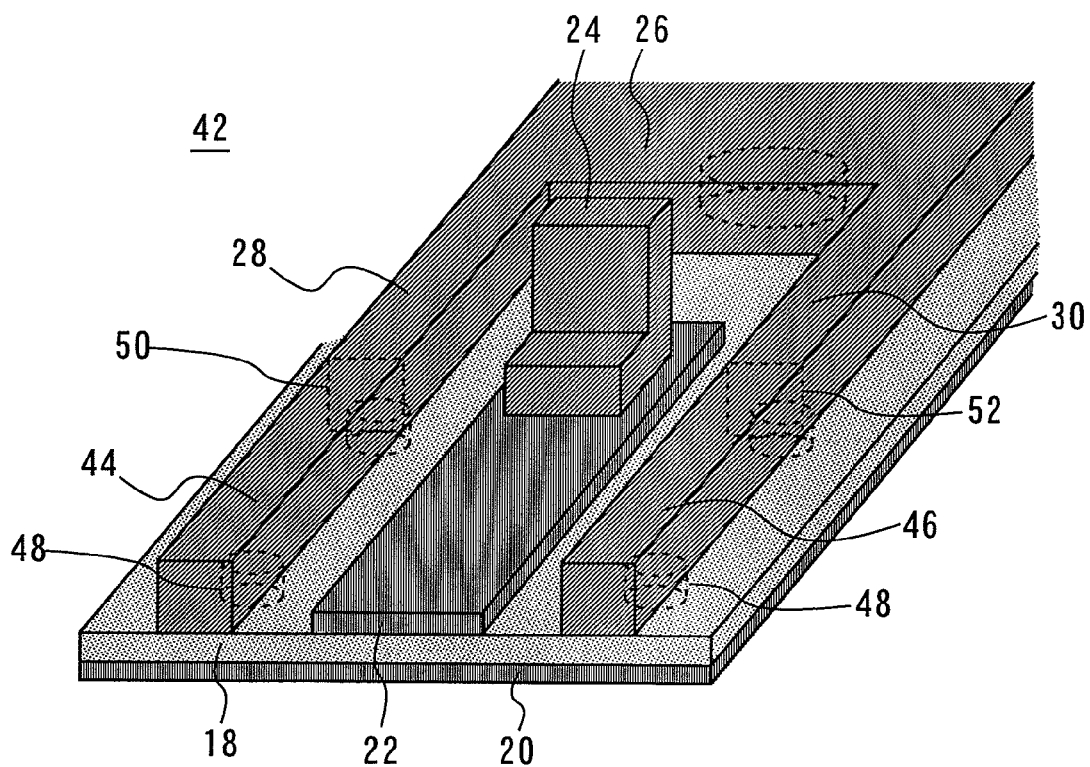
FIG. 4 is a perspective view of a radiofrequency contactor according to the second embodiment.

FIG. 4 is a perspective view of a radiofrequency contactor according to the second embodiment. The radiofrequency contactor 42 has, in addition to the components of the radiofrequency contactor 10 according to the first embodiment, a first wiring conductor-side ground conductor 44 and a second wiring conductor-side ground conductor 46 provided on the opposite sides of the radiofrequency signal wiring conductor 22 on the dielectric substrate 18. The radiofrequency signal wiring conductor 22, the first wiring conductor-side ground conductor 44, the second wiring conductor-side ground conductor 46 and the lower surface ground conductor 20 constitute a coplanar line. The first wiring conductor-side ground conductor 44 is connected to the first side ground conductor 28. The second wiring conductor-side ground conductor 46 is connected to the second side ground conductor 30. The first wiring conductor-side ground conductor 44 and the second wiring conductor-side ground conductor 46 are connected to the lower surface ground conductor 20 through a plurality of vias 48 provided in the dielectric substrate 18.

Advantages of the Second Embodiment

In the radiofrequency contactor 10 according to the first embodiment, as shown in FIG. 2, when a radiofrequency signal is input to the radiofrequency semiconductor device 12 via the radiofrequency signal wiring conductor 22, only the lower surface ground conductor 20 functions as a ground surface opposed to the radiofrequency signal before the radiofrequency signal passes through portions in the vicinities of an end 50 of the first side ground conductor 28 and an end 52 of the second side ground conductor 30. After passage of the radiofrequency signal through the end 50 of the first side ground conductor 28 and the end 52 of the second side ground conductor 30, however, the first side ground conductor 28 and the second side ground conductor 30 also function as a ground surface. Therefore the characteristic impedance of the radiofrequency signal wiring conductor 22 is changed in the vicinities of the end 50 of the first side ground conductor 28 and the end 52 of the second side ground conductor 30. As a result, the radiofrequency signal deteriorates when passing through the vicinities of the end 50 of the first side ground conductor 28 and the end 52 of the second side ground conductor 30.

On the other hand, in the radiofrequency contactor 42 according to the second embodiment, the first wiring conductor-side ground conductor 44, the first side ground conductor 28, the second wiring conductor-side ground conductor 46, the second side ground conductor 30 and the lower surface ground conductor 20 function as a ground surface opposed to a radiofrequency signal with the radiofrequency signal passing through the radiofrequency signal wiring conductor 22 at any position with respect to the length of the radiofrequency signal wiring conductor 22. Thus, the change in characteristic impedance of the radiofrequency signal wiring conductor 22 in the vicinities of the end 50 of the first side ground conductor 28 and the end 52 of the second side ground conductor 30 can be reduced. As a result, prevention of a deterioration of a radiofrequency signal passing through the radiofrequency signal pin contactor 24 in an inspection of the radiofrequency semiconductor device 12 is enabled more reliably than in the first embodiment.

Even if the first wiring conductor-side ground conductor 44 and the second wiring conductor-side ground conductor 46 are not connected to the lower surface ground conductor 20 through the vias 48, they can have the role of a ground surface. Thus, prevention of a deterioration of a radiofrequency signal passing through the radiofrequency signal pin contactor 24 in an inspection of the radiofrequency semiconductor device 12 is enabled more reliably than in the first embodiment.

The ground block 26, the first side ground conductor 28, the second side ground conductor 30, the first wiring conductor-side ground conductor 44 and the second wiring conductor-side ground conductor 46 are mounted as component parts in the radiofrequency contactor 42. Therefore, component part selections most suitable for prevention of deterioration at the time of passage of a radiofrequency signal through the radiofrequency signal pin contactor 24 can be made.

Third Embodiment

A radiofrequency contactor according to a third embodiment of the present invention will be described mainly with respect to a point of difference from the second embodiment.

Figure 5:
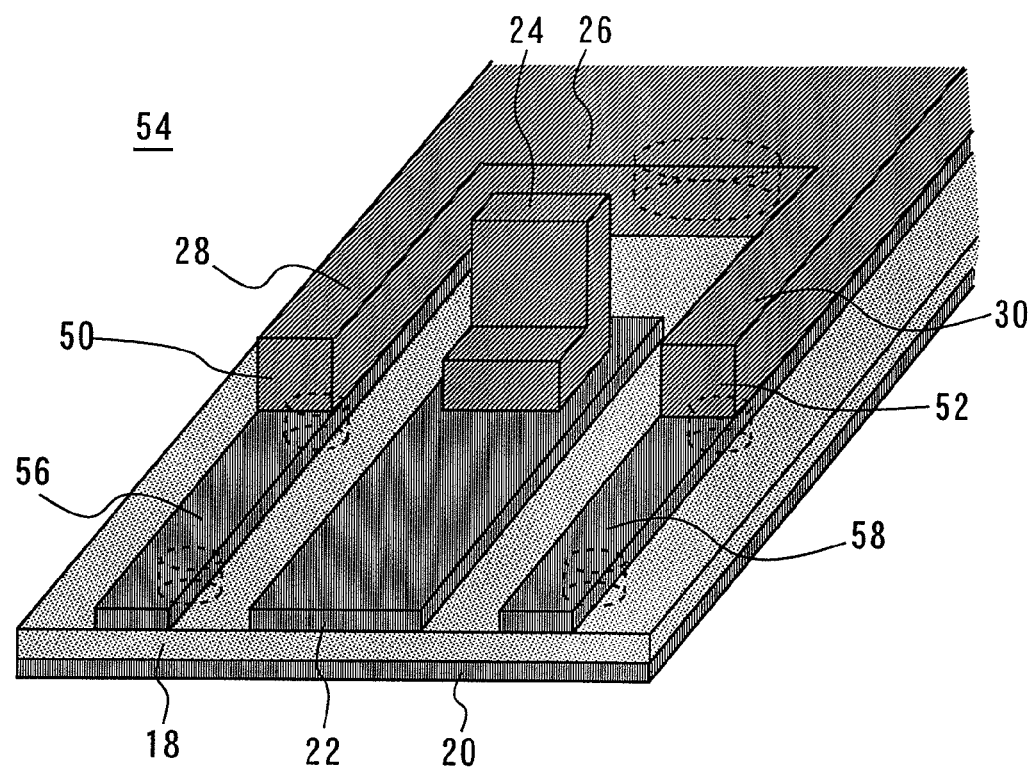
FIG. 5 is a perspective view of a radiofrequency contactor 54 according to the third embodiment.

FIG. 5 is a perspective view of a radiofrequency contactor 54 according to the third embodiment. In the radiofrequency contactor 54 according to the third embodiment, the first wiring conductor-side ground conductor 56 and the second wiring conductor-side ground conductor 58 have the same thickness as that of the radiofrequency signal wiring conductor 22 unlike those in the radiofrequency contactor 42 according to the second embodiment.

In the third embodiment, therefore, the first wiring conductor-side ground conductor 56 and the second wiring conductor-side ground conductor 58 can be formed as the same thin film as the radiofrequency signal wiring conductor 22, while prevention of a deterioration of a radiofrequency signal at the time of passage through the radiofrequency signal pin contactor 24 is enabled, thus enabling simplification of the manufacturing process.

Fourth Embodiment

A radiofrequency contactor according to a fourth embodiment of the present invention will be described mainly with respect to a point of difference from the first embodiment.

Figure 6:
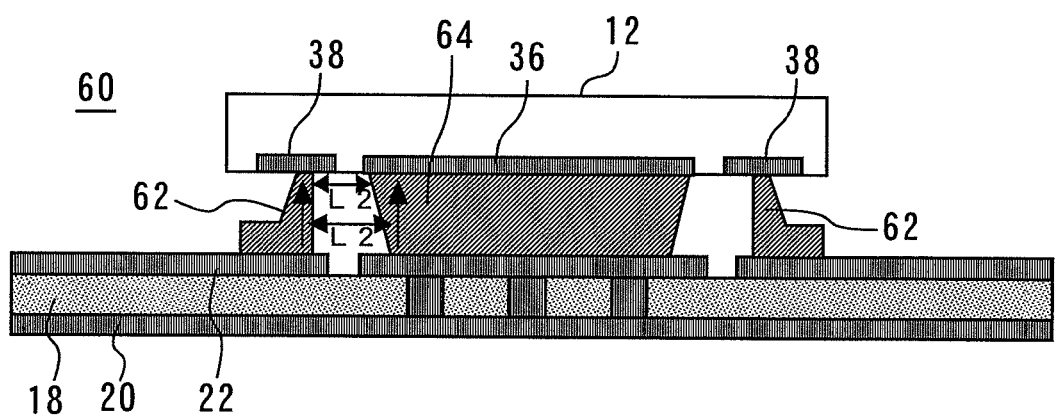
FIG. 6 is a sectional view of a radiofrequency contactor according to the fourth embodiment.

FIG. 6 is a sectional view of a radiofrequency contactor according to the fourth embodiment. The radiofrequency contactor 60 has a radiofrequency signal pin contactor 62 different from that in the first embodiment. The radiofrequency signal pin contactor 62 is constructed so that its thickness decreases with approach to its tip (with approach to a higher position in the direction of the solid line arrow in FIG. 6) for connection to the radiofrequency signal electrode 38 with improved reliability. A ground block 64 is constructed so that the distance (L2 in FIG. 6) between the radiofrequency signal pin contactor 62 and a portion of the ground block 64 opposed to the radiofrequency signal pin contactor 62 becomes smaller with approach to the tip of the radiofrequency signal pin contactor 62 (with approach to a higher position in the direction of the solid line arrow in FIG. 6).

In general, in a microstrip line structure, the characteristic impedance becomes higher with reduction in thickness of the signal wiring conductor, and the characteristic impedance becomes lower with reduction in distance between the signal wiring conductor and the ground conductor. As described above, the radiofrequency signal pin contactor 62 is constructed so that its thickness decreases with approach to its tip. Therefore, if the distance between the radiofrequency signal pin contactor 62 and the portion of the ground block 64 opposed to the radiofrequency signal pin contactor 62 is constant at any position, the characteristic impedance in the microstrip line structure constituted of the radiofrequency signal pin contactor 62 and the ground block 64 becomes higher with approach to the tip of the radiofrequency signal pin contactor 62 (with approach to a higher position in the direction of the solid line arrow in FIG. 6). With this construction, therefore, there is a problem that a radiofrequency signal deteriorates when passing through the radiofrequency signal pin contactor 62.

In the fourth embodiment, therefore, the ground block 64 is constructed so that the distance between the radiofrequency signal pin contactor 62 and the portion of the ground block 64 opposed to the radiofrequency signal pin contactor 62 becomes smaller with approach to the tip of the radiofrequency signal pin contactor 62 (with approach to a higher position in the direction of the solid line arrow in FIG. 6). In the microstrip line structure constituted of the radiofrequency signal pin contactor 62 and the ground block 64, therefore, the effect of reducing the characteristic impedance with approach to the tip of the radiofrequency signal pin contactor 62 (with approach to a higher position in the direction of the solid line arrow in FIG. 6) is achieved. The above-described influence that increases the characteristic impedance with approach to the tip of the radiofrequency signal pin contactor 62 is thereby cancelled out. Prevention of a deterioration of a radiofrequency signal at the time of passage through the radiofrequency signal pin contactor 62 in an inspection of the radiofrequency semiconductor device 12 is thus enabled.

Fifth Embodiment

A radiofrequency contactor according to a fifth embodiment of the present invention will be described mainly with respect to a point of difference from the first embodiment.

Figure 7:
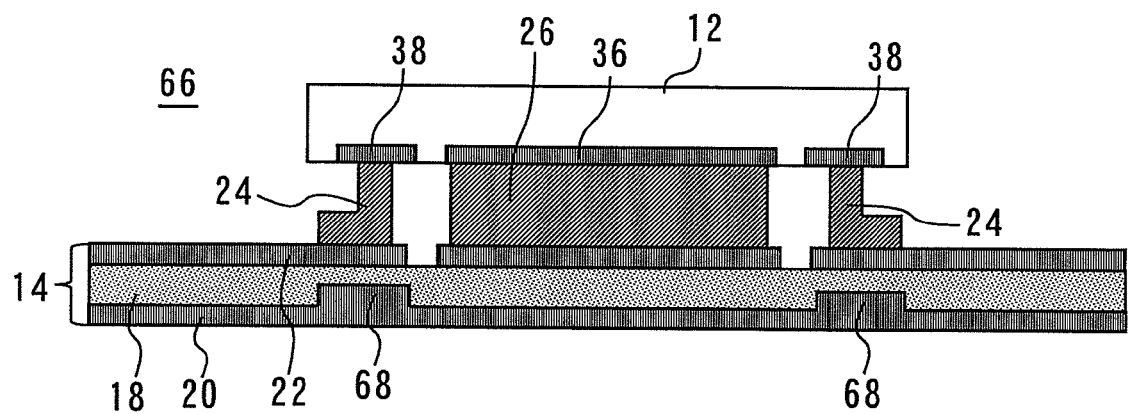
FIG. 7 is a sectional view of a radiofrequency contactor according to the fifth embodiment.

FIG. 7 is a sectional view of a radiofrequency contactor according to the fifth embodiment. The fifth embodiment differs from the first embodiment in that the lower surface ground conductor 20 has a projection 68 projecting toward the radiofrequency signal pin contactor 24 on its portion opposed to the radiofrequency signal pin contactor 24 through the radiofrequency signal wiring conductor 22 and the dielectric substrate 18.

In a microstrip line structure such as that in the comparative example shown in FIG. 3, constituted of the radiofrequency signal pin contactor 24 and the ground block 26, the inductance component becomes larger than that in the microstrip line structure of the testing circuit board 14. In the comparative example, therefore, the characteristic impedance of the radiofrequency signal pin contactor 24 is higher than the characteristic impedance (a constant value) of the radiofrequency signal wiring conductor 22. Thus, the characteristic impedance of the radiofrequency signal pin contactor 24 does not match the characteristic impedance of the radiofrequency signal wiring conductor 22. With inspection of the radiofrequency semiconductor device 12 in the comparative example, therefore, there is a problem that a radiofrequency signal deteriorates when passing through the radiofrequency signal pin contactor 24.

In the fifth embodiment, to solve this problem, the above-described projection 68 is formed on the lower surface ground conductor 20. The distance between the radiofrequency signal wiring conductor 22 and the lower surface ground conductor 20 is thereby made smaller in the portion where the radiofrequency signal pin contactor 24 is provided than in other portions. The capacitive component of the microstrip line structure of the testing circuit board 14 is thereby increased in the portion where the radiofrequency signal pin contactor 24 is provided. By the influence of this increase in the capacitive component, the influence of an increase in the characteristic impedance due to an increase in the inductance component, which is the problem with the comparative example compared with the first embodiment, is cancelled out. The increase in the characteristic impedance of the radiofrequency signal pin contactor 24 relative to the characteristic impedance (a constant value) of the radiofrequency signal wiring conductor 22 can be reduced. Thus, in the fifth embodiment, the characteristic impedance of the radiofrequency signal pin contactor 24 and characteristic impedance of the radiofrequency signal wiring conductor 22 can be matched to each other, thereby enabling prevention of a deterioration of a radiofrequency signal at the time of passage through the radiofrequency signal pin contactor 24 in an inspection of the radiofrequency semiconductor device 12.

Sixth Embodiment

A radiofrequency contactor according to a sixth embodiment of the present invention will be described mainly with respect to a point of difference from the first embodiment.

Figure 8:
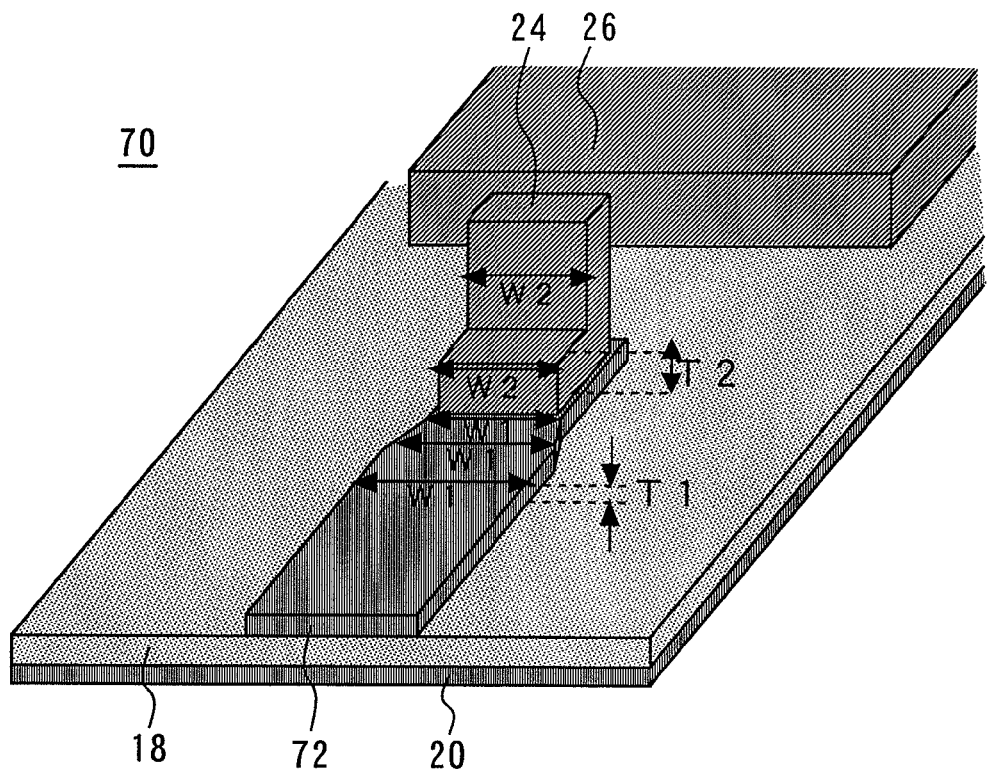
FIG. 8 is a perspective view of a radiofrequency contactor according to the sixth embodiment.

FIG. 8 is a perspective view of a radiofrequency contactor according to the sixth embodiment. In FIG. 8, the width of a radiofrequency signal wiring conductor 72 is indicated by W1, and the width of the radiofrequency signal pin contactor 24 by W2. The sixth embodiment differs from the first embodiment in that the width W1 of the radiofrequency signal wiring conductor 72 becomes closer to the width W2 of the radiofrequency signal pin contactor 24 with approach to the radiofrequency signal pin contactor 24. In FIG. 8, the thicknesses of the radiofrequency signal wiring conductor 72 and the radiofrequency signal pin contactor 24 are respectively indicated by T1 and T2 for reference in description of a seventh embodiment.

In the radiofrequency contactor 40 according to the comparative example compared with the first embodiment, as shown in FIG. 3, the width W2 of the radiofrequency signal pin contactor 24 is smaller than the width W1 of the radiofrequency signal wiring conductor 22. In general, in a microstrip line structure, the characteristic impedance becomes higher with reduction in width of the signal wiring conductor. In the radiofrequency contactor 40 according to the comparative example, therefore, the characteristic impedance is higher at the radiofrequency signal pin contactor 24 than at the radiofrequency signal wiring conductor 22 and changes abruptly in the vicinity of the connection between the radiofrequency signal wiring conductor 22 and the radiofrequency signal pin contactor 24. With the comparative example compared with the first embodiment, therefore, there is a problem that a radiofrequency signal deteriorates when passing through the radiofrequency signal pin contactor 24 after passing through the radiofrequency signal wiring conductor 22 in an inspection.

In the radiofrequency contactor 70 according to the sixth embodiment, therefore, the radiofrequency signal wiring conductor 72 is constructed so that its width W1 becomes closer to the width W2 of the radiofrequency signal pin contactor 24 with approach to the connection to the radiofrequency signal pin contactor 24. The change in the characteristic impedance due to the difference between the width W1 and the width W2 in the vicinity of the connection between the radiofrequency signal wiring conductor 72 and the radiofrequency signal pin contactor 24 is thereby made moderate. Prevention of a deterioration of a radiofrequency signal at the time of passage through the radiofrequency signal pin contactor 24 after passage through the radiofrequency signal wiring conductor 72 in an inspection is thus enabled.

Seventh Embodiment

A radiofrequency contactor according to a seventh embodiment of the present invention will be described mainly with respect to a point of difference from the sixth embodiment.

Figure 9:
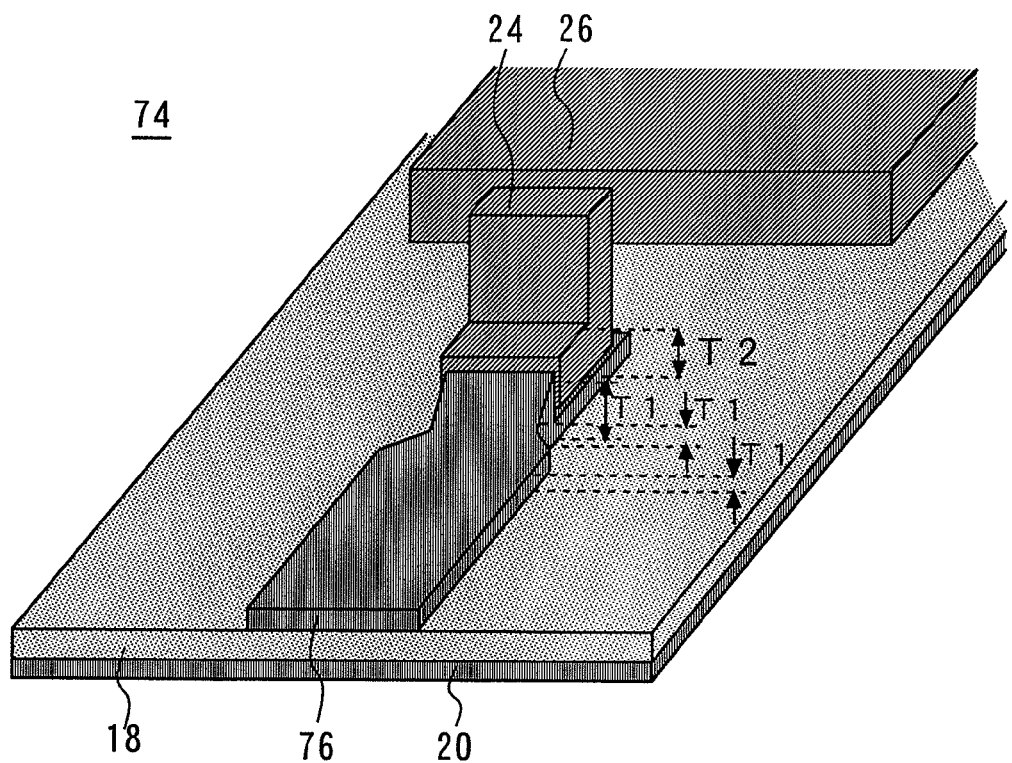
FIG. 9 is a perspective view of a radiofrequency contactor according to the seventh embodiment.

FIG. 9 is a perspective view of a radiofrequency contactor according to the seventh embodiment. In FIG. 9, the thickness of a radiofrequency signal wiring conductor 76 is indicated by T1, and the thickness of the radiofrequency signal pin contactor 24 by T2. In the radiofrequency contactor 74 according to the seventh embodiment, the radiofrequency signal wiring conductor 76 is constructed so that its thickness T1 becomes closer to the thickness T2 of the radiofrequency signal pin contactor 24 with approach to the connection to the radiofrequency signal pin contactor 24.

In the radiofrequency contactor 70 according to the sixth embodiment, as shown in FIG. 8, the thickness T2 of the radiofrequency signal pin contactor 24 is increased relative to the thickness T1 of the radiofrequency signal wiring conductor 72. In general, in a microstrip line structure, the characteristic impedance becomes lower with increase in thickness of the signal wiring conductor. In the radiofrequency contactor 70 according to the sixth embodiment, therefore, the characteristic impedance is lower at the radiofrequency signal pin contactor 24 than at the radiofrequency signal wiring conductor 72 and changes abruptly in the vicinity of the connection between the radiofrequency signal wiring conductor 72 and the radiofrequency signal pin contactor 24. There is, therefore, a problem that a radiofrequency signal deteriorates when passing through the radiofrequency signal pin contactor 24 after passing through the radiofrequency signal wiring conductor 72 in an inspection.

On the other hand, in the radiofrequency contactor 74 according to the seventh embodiment, the radiofrequency signal wiring conductor 76 is constructed so that its thickness T1 becomes closer to the thickness T2 of the radiofrequency signal pin contactor 24 with approach to the connection to the radiofrequency signal pin contactor 24. In the radiofrequency contactor 74, therefore, the change in the characteristic impedance due to the difference between the thicknesses T1 and T2 in the vicinity of the connection between the radiofrequency signal wiring conductor 76 and the radiofrequency signal pin contactor 24 is made moderate. Prevention of a deterioration of a radiofrequency signal at the time of passage through the radiofrequency signal pin contactor 24 after passage through the radiofrequency signal wiring conductor 76 in an inspection is thus enabled in the seventh embodiment.

The major benefits of the present invention described above are summarized follows.

According to one aspect of the present invention, prevention of deterioration of a radiofrequency signal is enabled.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-3780, filed on Jan. 9, 2009 including specification, claims, drawings and summary, on which the Convention priority of the present application is based, are incorporated herein by reference in its entirety.

What is claimed is:

1. A radiofrequency contactor for inspecting electrical characteristics of a radiofrequency semiconductor device having a radiofrequency signal electrode and a ground electrode, the radiofrequency contactor comprising:

a testing circuit board of a microstrip line structure having a dielectric substrate, a lower surface ground conductor on a lower surface of the dielectric substrate, and a radiofrequency signal wiring conductor on an upper surface of the dielectric substrate;

a radiofrequency signal pin contactor located on the upper surface of the dielectric substrate and connected to the radiofrequency signal wiring conductor;

a ground block located on the upper surface of the dielectric substrate and spaced apart from the radiofrequency signal wiring conductor and the radiofrequency signal pin contactor, the ground block being connected to the lower surface ground conductor; and a first side ground conductor and a second side ground conductor located on the upper surface of the dielectric substrate and spaced apart from the radiofrequency signal wiring conductor and the radiofrequency signal pin contactor, the first side ground conductor and the second side ground conductor being connected to the ground block, wherein a radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device in an inspection, the ground block is conductive to the ground electrode of the radiofrequency semiconductor device in the inspection, the first side ground conductor is located on the upper surface of the dielectric substrate away from the radiofrequency signal pin contactor in a direction perpendicular to a direction in which the ground block and the radiofrequency signal pin contactor are opposed to each other, and the second side ground conductor is located on the upper surface of the dielectric substrate, across the radiofrequency signal pin contactor from the first side ground conductor.

2. The radiofrequency contactor according to claim 1, wherein a lower portion of the first side ground conductor and a lower portion of the second side ground conductor are connected to the lower surface ground conductor.

3. The radiofrequency contactor according to claim 2, further comprising a first wiring conductor-side ground conductor and a second wiring conductor-side ground conductor respectively located on opposite sides of the radiofrequency signal wiring conductor on the upper surface of the dielectric substrate, wherein the radiofrequency signal wiring conductor, the first wiring conductor-side ground conductor, the second wiring conductor-side ground conductor, and the lower surface ground conductor constitute a coplanar the first wiring conductor-side ground conductor is connected to the first side ground conductor, and the second wiring conductor-side ground conductor is connected to the second side ground conductor.

4. The radiofrequency contactor according to claim 3, wherein the first wiring conductor-side ground conductor and the second wiring conductor-side ground conductor have the same thickness as the radiofrequency signal wiring conductor.

5. The radiofrequency contactor according to claim 4, wherein a lower portion of the first wiring conductor-side ground conductor and a lower portion of the second wiring conductor-side ground conductor are connected to the lower surface ground conductor.

6. The radiofrequency contactor according to claim 3, wherein a lower portion of the first wiring conductor-side ground conductor and a lower portion of the second wiring conductor-side ground conductor are connected to the lower surface ground conductor.

7. The radiofrequency contactor according to claim 1, further comprising a first wiring conductor-side ground conductor and a second wiring conductor-side ground conductor respectively located on opposite sides of the radiofrequency signal wiring conductor, on the upper surface of the dielectric substrate, wherein
the radiofrequency signal wiring conductor, the first wiring conductor-side ground conductor, the second wiring conductor-side ground conductor, and the lower surface ground conductor constitute a coplanar,
the first wiring conductor-side ground conductor is connected to the first side ground conductor, and
the second wiring conductor-side ground conductor is connected to the second side ground conductor.

8. The radiofrequency contactor according to claim 7, wherein the first wiring conductor-side ground conductor and the second wiring conductor-side ground conductor have the same thickness as the radiofrequency signal wiring conductor.

9. The radiofrequency contactor according to claim 8, wherein a lower portion of the first wiring conductor-side ground conductor and a lower portion of the second wiring conductor-side ground conductor are connected to the lower surface ground conductor.

10. The radiofrequency contactor according to claim 7, wherein a lower portion of the first wiring conductor-side ground conductor and a lower portion of the second wiring conductor-side ground conductor are connected to the lower surface ground conductor.

11. A radiofrequency contactor for inspecting electrical characteristics of a radiofrequency semiconductor device having a radiofrequency signal electrode and a ground electrode, the radiofrequency contactor comprising:
a testing circuit board of a microstrip line structure having a dielectric substrate, a lower surface ground conductor on a lower surface of the dielectric substrate, and a radiofrequency signal wiring conductor on an upper surface of the dielectric substrate;
a radiofrequency signal pin contactor located on the upper surface of the dielectric substrate and connected to the radiofrequency signal wiring conductor; and
a ground block located on the upper surface of the dielectric substrate and spaced apart from the radiofrequency signal wiring conductor and the radiofrequency signal pin contactor, the ground block being connected to the lower surface ground conductor, wherein
a radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device in an inspection,
the ground block is conductive to the ground electrode of the radiofrequency semiconductor device in the inspection,
the radiofrequency signal pin contactor has a thickness that decreases approaching a tip of the radiofrequency signal pin contactor, and
the ground block is constructed so that distance between the radiofrequency signal pin contactor and a portion of the ground block opposed to the radiofrequency signal pin contactor becomes smaller approaching the tip of the radiofrequency signal pin contactor.

12. A radiofrequency contactor for inspecting electrical characteristics of a radiofrequency semiconductor device having a radiofrequency signal electrode and a ground electrode, the radiofrequency contactor comprising:
a testing circuit board of a microstrip line structure having a dielectric substrate, a lower surface ground conductor on a lower surface of the dielectric substrate, and a radiofrequency signal wiring conductor on an upper surface of the dielectric substrate;
a radiofrequency signal pin contactor located on the upper surface of the dielectric substrate and connected to the radiofrequency signal wiring conductor; and
a ground block located on the upper surface of the dielectric substrate and spaced apart from the radiofrequency signal wiring conductor and the radiofrequency signal pin contactor, the ground block being connected to the lower surface ground conductor, wherein
a radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device in an inspection;
the ground block is conductive to the ground electrode of the radiofrequency semiconductor device in the inspection, and
the lower surface ground conductor has a projection projecting toward the radiofrequency signal pin contactor, on a portion of the lower surface ground conductor opposed to the radiofrequency signal pin contactor, through the radiofrequency signal wiring conductor and the dielectric substrate.

13. A radiofrequency contactor for inspecting electrical characteristics of a radiofrequency semiconductor device having a radiofrequency signal electrode and a ground electrode, the radiofrequency contactor comprising:
a testing circuit board of a microstrip line structure having a dielectric substrate, a lower surface ground conductor on a lower surface of the dielectric substrate, and a radiofrequency signal wiring conductor on an upper surface of the dielectric substrate;
a radiofrequency signal pin contactor located on the upper surface of the dielectric substrate and connected to the radiofrequency signal wiring conductor; and
a ground block located on the upper surface of the dielectric substrate and spaced apart from the radiofrequency signal wiring conductor and the radiofrequency signal pin contactor, the ground block being connected to the lower surface ground conductor, wherein
a radiofrequency signal is sent from the radiofrequency signal pin contactor to the radiofrequency signal electrode of the radiofrequency semiconductor device or received by the radiofrequency signal pin contactor from the radiofrequency signal electrode of the radiofrequency semiconductor device in an inspection, the ground block is conductive to the ground electrode of the radiofrequency semiconductor device in the inspection, and the radiofrequency signal wiring conductor has a width that becomes closer to width of the radiofrequency signal pin contactor approaching the connection of the radiofrequency signal wiring conductor to the radiofrequency signal pin contactor.

14. The radiofrequency contactor according to claim 13, wherein the radiofrequency signal wiring conductor has a thickness that becomes closer to thickness of the radiofrequency signal pin contactor approaching the connection of the radiofrequency signal wiring conductor the radiofrequency signal pin contactor.

* * * * *